United States Patent [19]

Sauer

[11] 4,122,401

[45] Oct. 24, 1978

[54] HIGH EFFICIENCY POWER AMPLIFIER CIRCUIT

[75] Inventor: Donald Roy Sauer, San Jose, Calif.

[73] Assignee: National Semiconductor Corporation, Santa Clara, Calif.

[21] Appl. No.: 815,734

[22] Filed: Jul. 14, 1977

[51] Int. Cl.[2] .................................. H03F 3/45
[52] U.S. Cl. .................................. 330/257; 330/288; 330/296; 330/298
[58] Field of Search .................... 330/153, 156, 207 P, 330/252, 254, 257, 288, 296, 298, 311

[56] References Cited

U.S. PATENT DOCUMENTS

| | | | |
|---|---|---|---|
| 3,992,678 | 11/1976 | Suzuki | 330/298 X |
| 4,021,701 | 5/1977 | Davies | 330/207 P |

OTHER PUBLICATIONS

Ahmed, "Zero-Offset Potential Follower Circuits", RCA Technical Notes TN No. 938, Sep. 17, 1973, 7 sheets.

Primary Examiner—James B. Mullins
Attorney, Agent, or Firm—Harry Max Weiss

[57] ABSTRACT

The invention described herein is essentially a single ended power amplifier circuit properly biased to avoid crossover distortion and comprising in its output stage an NPN power transistor connected between a positive voltage source and a load. The base of the NPN transistor is connected to the collector of a PNP power transistor whose emitter is also connected to the positive voltage source. The parallel NPN/PNP transistor composite arrangement is a major feature in the power amplifier circuit resulting in a reasonably low quiescent current, low distortion, inherent stability, and ease in biasing. The composite combination of the PNP/NPN output transistors are driven by a single high Beta NPN input transistor driving the base of the PNP output transistor through a diode connected PNP transistor with unity current gain. The PNP output transistor drives the base terminal of the NPN output transistor. An alternate embodiment is disclosed which utilizes two overload protective transistors.

25 Claims, 2 Drawing Figures

HIGH EFFICIENCY POWER AMPLIFIER CIRCUIT

BACKGROUND OF THE INVENTION

1. Field of the Invention

This invention relates generally to electronic circuits designed to supply audio frequency power to a load and, more particularly, to high efficiency bipolar power amplifier circuits which can be fabricated on a monolithic chip in what is commonly known as an integrated circuit.

2. Description of the Prior Art

In the past, several prior art types of circuits have been widely used as compact power amplifiers. One prior arrangement used series connected NPN/PNP transistors, with the load connected to the emitters at the midpoint of the complementary pair. The base-emitter junctions of the prior art circuit were slightly forward biased to reduce crossover distortion and if the transistor Betas were similar then half of the supply voltage appeared at the output terminal and each transistor could alternatively be driven to $V_{CE(SAT)}$. However, there were two drawbacks to this type of prior art complementary pair power amplifier: the PNP transistor was generally to large and could not be readily integrated into monolithic semiconductor chip and the high frequency output of the PNP transistor was, inherently, lower than its NPN counterpart which often created design problems.

Another prior art type of audio output circuit used two NPN transistors connected as a Darlington pair in the output stage. Higher power output could also be obtained with this prior art circuit with the use of a series resistor in the V+ connection to the driver transistors which resistor is equal to several times the load resistance. A large external capacitor was also connected from the output amplifier terminal to the driver end of the series resistor. This is a so called Bootstrap connection which, when properly designed, will produce output voltage swings in excess of one half of the V+ supply. One of the objections to Boot-strapping is the need for the external capacitor which increases the cost and bulk of the amplifier. Power loss in the driver dropping resistor was also a drawback.

U.S. Pat. No. 3,938,053 filed Sept. 19, 1974, by Menniti et al describes still another Class-B type of power amplifier designed for a monolithic IC chip. This circuit uses an NPN output transistor whose base is driven by an NPN control transistor through an intermediate pair of PNP transistors whose emitters are connected to the V+ supply. The V+ supply is also connected to the collector of the NPN output transistor. The base terminals of the intermediate PNP transistors are connected together and the common base lead is connected to the collector lead of one of the PNP pairs and to the collector terminal of the NPN control transistor. The emitter of the NPN control transistor is connected to the output load terminal which is also connected to the emitter of the NPN output transistor. The collector terminal of the other PNP intermediate transistor is connected to the base terminal of the NPN output transistor. On positive half-cycles of the signal to be amplified, this intermediate PNP transistor saturates prior to saturation of the input transistor, thereby increasing the output voltage at the load terminal.

The above described prior art amplifier, while not attaining the voltage swing across the load equal to a power amplifier circuit having a Bootstrap feature, does avoid the necessity of a large off-chip capacitor. The direct connection between the emitter of the control transistor and the output terminal causes HF response problems under some load conditions. The overall current gain of this prior art circuit is only about 10,000.

The foregoing discussion of prior art power amplifier circuits demonstrates that a need exists for an improved power amplifier circuit which can be fabricated in an IC chip, which does not require expensive or bulky external components and which is inherently stable under all load, input, supply, and high frequency output situations and which due to its high input impedance has an overall current gain of at least 100,000.

SUMMARY OF THE INVENTION

Accordingly, it is an object of this invention to provide a high efficiency audio power amplifier circuit, designed for fabrication in the form of an integrated circuit.

It is another object of this invention to provide an improved power amplifier circuit which is inherently stable under all load, input, supply and high frequency output situations.

It is still another object of this invention to provide a very high current gain power amplifier circuit which does not require any external components.

DESCRIPTION OF THE PREFERRED EMBODIMENTS

In accordance with one embodiment of this invention, a high efficiency power amplifier circuit comprises input transistor means for selectively turning the circuit on and off depending upon the voltage level of the input signal. Current gain transistor means are coupled to the input transistor means for amplifying the input signal by at least 100,000. The current gain transistor means comprises a PNP current amplifier transistor and a NPN output transistor connected together as a composite pair. Also included as features of the circuit is a first resistor means connected between the base and emitter terminals of the NPN output transistor for establishing the $V_{BE}$ of the NPN output transistor and for speeding turnoff of the NPN output transistor, a second resistor means connected to the first resistor means, to the emitter terminal of the NPN output transistor, to an output terminal, and to ground for equally dividing the voltage of a power supply connected to the circuit under a no signal condition. Other features include current sink means connected to the emitter of the input transistor means for sinking current flowing between the composite pair and the input transistor means, and a D.C. power source connected to the collector of the NPN output transistor and the emitter of the PNP current amplifier transistor.

In another circuit embodiment, input circuit protection means are connected to the input transistor means for protecting the circuit from an excessive input signal. In this circuit embodiment, a current source means is connected to both the input transistor means and to the input circuit protection means for providing a source of current to the input transistor means.

The objectives of this invention are met: (a) through the use of an NPN/PNP composite transistor output circuit which supplies an audio output voltage approaching one half of the V+ supply voltage (less one $V_{BE}$ drop or 0.8 volts).

(b) through the use of especially tailored transistor characteristics and controlled transistor Betas resulting in low distortion, high peak output current, excellent circuit stability, and ease in circuit biasing. While energy dissipation is low under a no signal condition, heat sinking is necessary at high output, so one of the amplifier terminals is preferably in the form of a metal tab suitable for coupling to a heat sink.

Another embodiment of the power amplifier circuit uses two additional transistors which provide an optional output current limiting arrangement, thereby permitting fast turn off of the output transistor in case of gross overdrive of the amplifier, thus reducing the possibility of destruction of the IC or damage to the loudspeaker load connected thereto.

The foregoing and other objects, features and advantages of the invention will be apparent from the following, more particular, description of the preferred embodiment of the invention, as illustrated in the accompanying drawings.

THE SPECIFICATION

Figure 1:
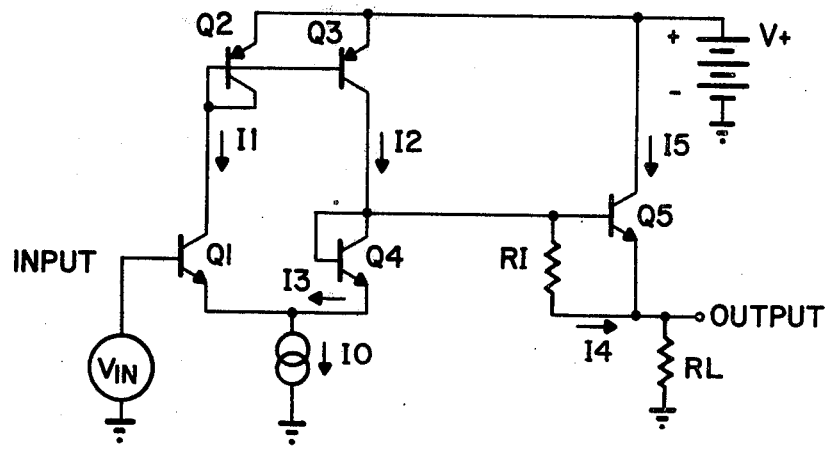
FIG. 1 is a simplified electrical schematic diagram of the power amplifier circuit of this invention.

Referring to FIG. 1, the simplified electrical schematic diagram shows an amplifier comprising transistors Q1 through Q5, two resistors RI and RL with a single voltage source V+ and a constant current sink I0. An input signal (Vin) is applied to the base terminal of Q1 which is an NPN high Beta transistor with a current gain of 100. Base biasing for Q1 is provided, but not shown in FIG. 1. The collector terminal of Q1 is connected to base and collector terminals of Q2, which is a PNP transistor. The emitter terminal of Q1 is connected to the ungrounded terminal of the constant current sink, I0, and to the emitter terminal of Q4. The emitter lead or terminal of Q2 is connected to the V+ bus and Q2's base terminal is also connected to the base terminal of Q3, which is also a PNP transistor that is 30 times larger than Q2. Q3's emitter terminal is connected to the V+ bus and its collector terminal is connected to the junction of common connections to the base terminal of NPN output transistor Q5, the base and collector terminals of NPN transistor Q4 and one terminal of resistor RI. Both PNP transistor Q2 and NPN transistor Q4 are diode connected by having their base and collector leads or terminals connected together.

The collector terminal of the output NPN transistor Q5 is connected to the V+ bus and its emitter terminal is connected to the output terminal which is also connected to the ungrounded end of resistor RL and to one end of Q5's base-emitter shunt resistor RI.

Figure 2:
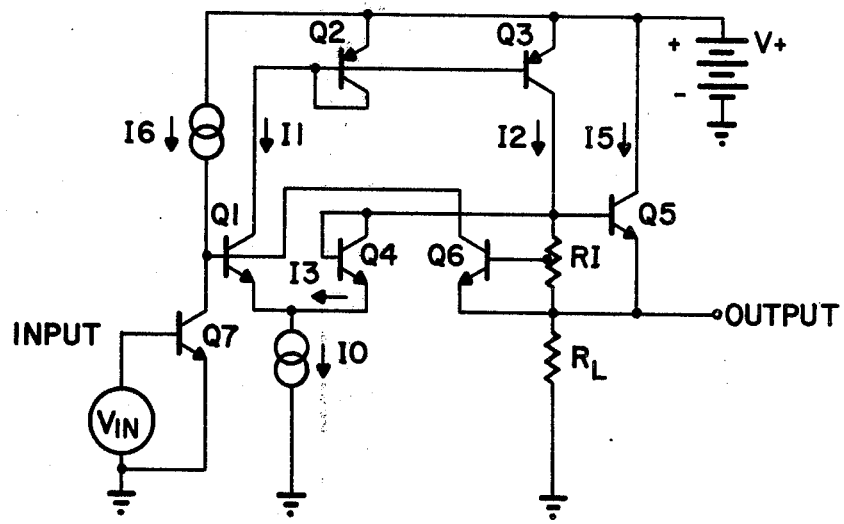
FIG. 2 is a simplified electrical schematic of a power amplifier circuit similar to FIG. 1 showing the addition of fast turn off circuitry with added transistors Q6 and Q7, which are optional features of the invention.

Referring to FIG. 2, transistors Q6 and Q7 are added to the electrical schematic of FIG. 1. NPN transistor Q7 is connected in the circuit before Q1. Vin is applied to the base terminal of Q7. The collector terminal of Q7 is connected to the base terminal of Q1 and to one end of a constant current bias source I6. The emitter terminal of Q7 is grounded. The base terminal of Q6 is connected to a tap on the base-emitter resistor RI of Q5. The emitter terminal of Q6 is connected to the Output terminal. Q6's collector terminal is connected to the base terminal of Q1 where it serves to limit the base current to Q1 under a high signal input situation.

POWER AMPLIFIER CIRCUIT OPERATION

In operation, the circuit is biased by appropriate selection of RL to draw a quiescent supply current of about 50 ma at a V+ supply of 12 volts. Q3 has 30 times the current capacity of Q2 (which is about the same as Q4) and Q5 has 100 times the current capacity as Q3. The voltage at the Output terminal remains at about 0.7 volts below the input voltage Vin. Assuming the Beta of Q1 and Q5 are high and currents I4 and I5 are small, current I3 is slightly less than I0. Current I1 is about 30 times smaller than I0. If the input voltage (Vin) increases, but the base voltage of Q5 doesn't, Q4 tends to turn off and Q1 turns on more. Current I2 increases since I1 is larger and I3 is smaller and this causes the base voltage of Q5 to rise. The maximum output current is high since the available base drive to Q5 is 30 times I0. The maximum voltage swing is limited by saturation of Q3 and the $V_{BE}$ of Q5. Under large signal conditions I2 is 30 times I1, I5 is equal to 30 times I1 times the Beta of Q5 which provides a current gain of approximately 100.

The input impedance at the base of Q1 is equal to 30 times the Beta of Q5 times the Beta of Q1, times RL. The input-output isolation and high input impedance at the base of Q1 helps reduce distortion.

The gain from the base of Q1 to the Output Terminal is less than unity, thus the amplifier is inherently stable. The power amplifier circuit of the invention has a theoretical current gain of 300,000 from input to output. If desired, the transistor devices of this circuit can be selected to provide a current amplification of the input signal to at least 100,000.

The geometries of transistors Q1 and Q2 are designed to control current I1. Thus, currents I1 and I2 are predictable, the emitter-base voltages of Q1 and Q4 can be controlled thus the D.C. circuit bias is easy to adjust. Q5's base-emitter resistor RI is a desirable feature for two reasons:

(a) The voltage drop across RI caused by current I4 sets Q5's base-emitter voltage, (b) shunt resistor Ri pulls current out of the base of Q5 which speeds its turn-off on signal swings.

In summary, when Vin at the base of Q1 swings above zero volts, the circuit turns on and then the circuit turns off.

Referring to FIG. 2, the base terminal of the optionally added overload transistor Q6 is connected to a tap on RI at less than the base voltage of Q5. The base-emitter voltage of Q6 is adjusted so the transistor Q6 turns on at the maximum safe power level for overall IC operation. The collector of Q6 is connected to the base current to Q1 and as Q6 is turned on the base current to Q1 is progressively limited. Transistor Q7 is placed in the amplifier input circuit, with Q7's collector terminal and Q1's base terminal driven from V+ supply through the constant current source I6. This is done to normalize Q1's base impedance so protective shutdown will occur under all overload conditions.

While the invention has been particularly shown and described with reference to the preferred embodiments thereof, it will be understood to those skilled in the art that the foregoing and other changes in form and details may be made therein without departing from the spirit and scope of the invention.

What is claimed is:

1. A high efficiency power amplifier circuit comprising input transistor means for selectively turning the circuit on and off depending upon the voltage level of the input signal, and current gain transistor means coupled to said input transistor means for amplifying the input signal by at least 100,000, said current gain transistor means comprising a PNP current amplifier transistor and a NPN output transistor connected together as a composite pair, said input transistor means being coupled to the base of said NPN output transistor, a first diode connected transistor connected to the collector of said input transistor means, one of said composite pair of transistors of said current gain transistor means having at least 30 times the current capacity of said first diode connected transistor.

2. A high efficiency power amplifier circuit as described in claim 1, wherein first resistor means is connected between the base and emitter terminals of said NPN output transistor for establishing the $V_{BE}$ of said NPN output transistor and for speeding turnoff of said NPN output transistor.

3. A high efficiency power amplifier circuit as described in claim 2, wherein second resistor means are connected to said first resistor means, to the emitter terminal of said NPN output transistor, an output terminal, and to ground for equally dividing the voltage of a power supply connected to said circuit under a no signal condition.

4. A high efficiency power amplifier circuit in accordance with claim 1 wherein said first diode connected transistor is a PNP diode connected transistor having the base connected to the collector.

5. A high efficiency power amplifier circuit in accordance with claim 4 including a second diode connected transistor, the base of said NPN output transistor being connected to the collector of said second diode connected transistor.

6. A high efficiency power amplifier circuit in accordance with claim 5 wherein said second diode connected transistor is a NPN diode connected transistor having the base connected to the collector.

7. A high efficiency power amplifier circuit in accordance with claim 1 including current sink means connected to the emitter of said input transistor means for sinking current flowing between said composite pair and said input transistor means.

8. A high efficiency power amplifier circuit in accordance with claim 1 including a D.C. power source connected to the collector of said NPN output transistor and the emitter of said PNP current amplifier transistor.

9. A high efficiency power amplifier circuit in accordance with claim 1 wherein first resistor means is connected between the base and emitter terminals of said NPN output transistor for establishing the $V_{BE}$ of said NPN output transistor and for speeding turnoff of said NPN output transistor, and second resistor means are connected to said first resistor means, to the emitter terminal of said NPN output transistor, an output terminal, and to ground for equally dividing the voltage of a power supply connected to said circuit under a no signal condition.

10. A high efficiency power amplifier circuit in accordance with claim 9 wherein said first diode connected transistor is a PNP diode connected transistor having the base connected to the collector; a second diode connected transistor, the base of said NPN output transistor being connected to the collector of said second diode connected transistor; said second diode connected transistor is a NPN diode connected transistor having the base connected to the collector; current sink means connected to the emitter of said input transistor means for sinking current flowing between said composite pair and said input transistor means, and a D.C. power source connected to the collector of said NPN output transistor and the emitter of said PNP current amplifier transistor.

11. A high efficiency power amplifier circuit in accordance with claim 1 including said first diode connected transistor is a PNP diode connected transistor having the base connected to the collector, a second diode connected transistor, the base of said NPN output transistor being connected to the collector of said second diode connected transistor, and said second diode connected transistor is a NPN diode connected transistor having the base connected to the collector.

12. A high efficiency power amplifier circuit in accordance with claim 1 including current sink means connected to the emitter of said input transistor means for sinking current flowing between said composite pair and said input transistor means, and a D.C. power source connected to the collector of said NPN output transistor and the emitter of said PNP current amplifier transistor.

13. A high efficiency power amplifier circuit as described in claim 1 including input circuit protection means connected to said input transistor means for protecting the circuit from an excessive input signal.

14. A high efficiency power amplifier circuit in accordance with claim 13 wherein said input circuit protection means comprising two transistors, one of said two transistors having a collector connected to the base of said input transistor means to disable said input transistor means under overload conditions.

15. A high efficiency power amplifier circuit in accordance with claim 14 wherein the other of said two transistors of said input circuit protection means being connected between said input transistor means and an input terminal.

16. A high efficiency power amplifier circuit in accordance with claim 15 wherein said one of said two transistors of said input circuit protection means being an NPN transistor having an emitter connected to the emitter of said NPN output transistor.

17. A high efficiency power amplifier circuit in accordance with claim 16 wherein first resistor means is connected between the base and emitter terminals of said NPN output transistor for establishing the $V_{BE}$ of said NPN output transistor and for speeding turnoff of said NPN output transistor, said NPN transistor of said input circuit protection means having the base connected to a point on said first resistor means.

18. A high efficiency power amplifier circuit in accordance with claim 16 wherein said other of said two transistors of said input circuit protection means being connected to the base of said input transistor means, wherein first resistor means is connected between the base and emitter terminals of said NPN output transistor for establishing the $V_{BE}$ of said NPN output transistor and for speeding turnoff of said NPN output transistor, said NPN transistor of said input circuit protection means having the base connected to a point on said first resistor means.

19. A high efficiency power amplifier circuit in accordance with claim 18 wherein current source means are connected to said input transistor means and to the other of said two transistors of said input circuit protection means for providing current to said input transistor means.

20. A high efficiency power amplifier circuit in accordance with claim 19 wherein second resistor means are connected to said first resistor means, to the emitter terminal of said NPN output transistor, output terminal, and to ground for equally dividing the voltage of a power supply connected to said circuit under a no signal condition.

21. A high efficiency power amplifier circuit in accordance with claim 20 including said first diode connected transistor is a PNP diode connected transistor having the base connected to the collector, a second diode connected transistor, the base of said NPN output transistor being connected to the collector of said second diode connected transistor, said second diode connected transistor is a NPN diode connected transistor having the base connected to the collector, current sink means connected to the emitter of said input transistor means for sinking current flowing between said composite pair and said input transistor means, and a D.C. power source connected to the collector of said NPN output transistor and the emitter of said PNP current amplifier transistor.

22. A high efficiency power amplifier circuit in accordance with claim 19 including said first diode connected transistor is a PNP diode connected transistor having the base connected to the collector, a second diode connected transistor, the base of said NPN output transistor being connected to the collector of said second diode connected transistor, said second diode connected transistor is a NPN diode connected transistor having the base connected to the collector.

23. A high efficiency power amplifier circuit in accordance with claim 19 including current sink means connected to the emitter of said input transistor means for sinking current flowing between said composite pair and said input transistor means, a D.C. power source connected to the collector of said NPN output transistor and the emitter of said PNP current amplifier transistor.

24. A high efficiency power amplifier circuit in accordance with claim 15 wherein said other of said two transistors of said input circuit protection means being connected to the base of said input transistor means.

25. A high efficiency power amplifier circuit in accordance with claim 24 wherein current source means are connected to said input transistor means and to the other of said two transistors of said input circuit protection means for providing current to said input transistor means.

* * * * *